US012643036B2

(12) United States Patent
Aoyagi

(10) Patent No.: US 12,643,036 B2
(45) Date of Patent: Jun. 2, 2026

(54) INPUT UNIT, INPUT DEVICE, AND COVER MOUNTABLE OVER INPUT UNIT

(71) Applicant: Sony Interactive Entertainment Inc., Tokyo (JP)

(72) Inventor: Satoshi Aoyagi, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 817 days.

(21) Appl. No.: 17/909,457

(22) PCT Filed: Mar. 15, 2021

(86) PCT No.: PCT/JP2021/010426
§ 371 (c)(1),
(2) Date: Sep. 6, 2022

(87) PCT Pub. No.: WO2021/187436
PCT Pub. Date: Sep. 23, 2021

(65) Prior Publication Data
US 2023/0127210 A1 Apr. 27, 2023

(30) Foreign Application Priority Data

Mar. 17, 2020 (JP) ................................. 2020-046866

(51) Int. Cl.
*A63F 13/24* (2014.01)
*A63F 13/98* (2014.01)
(Continued)

(52) U.S. Cl.
CPC .............. *A63F 13/24* (2014.09); *A63F 13/98* (2014.09); *G05G 1/00* (2013.01); *H05K 5/03* (2013.01); *A63F 2300/1043* (2013.01)

(58) Field of Classification Search
CPC .. A63F 13/24; A63F 13/98; A63F 2300/1043; H05K 5/03; G05G 1/06; G06F 3/0338; G06F 3/039
(Continued)

(56) References Cited

U.S. PATENT DOCUMENTS

2013/0178737 A1* 7/2013 Anelli ................... A61M 5/007
600/432
2015/0238855 A1* 8/2015 Uy .......................... A63F 13/24
463/37
(Continued)

FOREIGN PATENT DOCUMENTS

CN 104969321 A 10/2015
CN 105188864 A 12/2015
(Continued)

OTHER PUBLICATIONS

International Search Report for corresponding PCT Application No. PCT/JP2021/010426, 6 pages, dated Jun. 8, 2021.
(Continued)

*Primary Examiner* — Michael C Grant
(74) *Attorney, Agent, or Firm* — Fish & Richardson P.C.

(57) ABSTRACT

An input unit enables the force of a finger of a user to smoothly act on an input stick no matter whether the finger radially tilts the input stick or returns the input stick to an initial position. An input device includes an input stick. The input stick includes a touch section that is disposed on the uppermost part of the input stick and is to be touched by a thumb of the user. The upper surface of the touch section has an upward-swelling periphery. The input stick includes an outer region and an inner region. The outer region is disposed outside an apex of the periphery and has a pattern where at least either recesses or protrusions are regularly arranged. The inner region is disposed inside the apex of the
(Continued)

periphery and has a pattern where at least either recesses or protrusions are regularly arranged.

15 Claims, 12 Drawing Sheets

(51) Int. Cl.
*G05G 1/00* (2006.01)
*H05K 5/03* (2006.01)

(58) Field of Classification Search
USPC ........................................................ 273/147
See application file for complete search history.

(56) References Cited

U.S. PATENT DOCUMENTS

| | | | |
|---|---|---|---|
| 2016/0361636 A1* | 12/2016 | Gassoway | A63F 13/24 |
| 2017/0205821 A1 | 7/2017 | Peng | |
| 2017/0361222 A1 | 12/2017 | Tsuchiya | |
| 2018/0200617 A1* | 7/2018 | Tiffany | A63F 13/24 |
| 2021/0354030 A1* | 11/2021 | Falc | A63F 13/24 |

FOREIGN PATENT DOCUMENTS

| | | |
|---|---|---|
| CN | 107847798 A | 3/2018 |
| JP | 55012881 U | 1/1980 |
| JP | 2006001462 A | 1/2006 |
| JP | 2011143216 A | 7/2011 |
| JP | 2016123469 A | 7/2016 |
| WO | 2014061322 A1 | 4/2014 |

OTHER PUBLICATIONS

Shigeru Iwaizumi, "Find your favorite one! Game controller features2019" Game Watch Impress Corporation, 40 pages, dated Dec. 18, 2019.
Extended European Search Report for corresponding EP Application No. 21771989.7, 10 pages, dated Apr. 4, 2024.
Notice of Reasons for Refusal for corresponding JP Application No. 2022-508355, 9 pages, dated Feb. 22, 2024.
Hotline Games 2.0 PLUS Mouse Grip Tape, Japan, Ahon [online], 2017 years, 16 days, https://www.amazon.co.jp/Hotline-Health-Anti-Slip-Pre-Cut/dp/B08ML7W29F/?th=1, 5 pages, Aug. 16, 2017.
The ******** sole "HyperMouseSkater" of the unique specifications from Yossy, the operability of the, and the operability of the food A "Grips for Gaming ," Japan, https://www.negitaku.org/news/n Negitaku.org,2019-23414>, 4 pages, Jan. 8, 2024.
Corresponding application CN202180010888.5, "Office Action", Sep. 22, 2025, 4 pages.
Corresponding application EP21771989.7, "Intention to Grant", Sep. 11, 2025, 6 pages.

* cited by examiner

FIG.11

INPUT UNIT, INPUT DEVICE, AND COVER MOUNTABLE OVER INPUT UNIT

TECHNICAL FIELD

The present disclosure relates to a structure of an input unit to be provided in an input device used, for example, for game operation, and also relates to a structure of a cover mountable over the input unit.

BACKGROUND ART

Some input devices used for game operation include an input stick as an input unit that is to be moved by a finger of a user. The input stick includes a touch section that is disposed on the uppermost part of the input stick and is to be touched by the finger of the user. The input stick may be radially tilted and rotated around an initial position. The touch section described in PTL 1 is disk-shaped. The user places his/her thumb on the touch section to operate the input stick. The input unit includes a support mechanism. The support mechanism is disposed on the base of the input stick to support the input stick and is provided with a sensor for detecting a position (tilt) of the input stick.

PATENT LITERATURE

[PTL 1] PCT Patent Publication No. WO2014/061322

SUMMARY

Technical Problem

When the input stick is radially tilted from its initial position, a thumb applies a radial force while depressing the upper surface of the touch section. When the input stick is returned to its initial position, the thumb may apply a force to the outer rim of the touch section. No matter whether the thumb radially tilts the input stick or returns the input stick to its initial position, it is desirable that the force of the thumb smoothly act on the input stick.

Solution to Problem

An example of an input unit proposed by the present disclosure includes a touch section, an outer region, and an inner region. The touch section is provided with an upper surface having an upward-swelling periphery, and is radially movable from an initial position. The outer region is positioned outside the apex of the periphery and has a pattern where at least either recesses or protrusions are regularly arranged. The inner region is positioned inside the apex of the periphery and has a pattern where at least either recesses or protrusions are regularly arranged. This input unit enables the force of a thumb to smoothly act on the touch section no matter whether the thumb radially tilts the touch section or returns the touch section to the initial position.

Another example of the input unit proposed by the present disclosure includes a touch section, an outer region, and an inner region. The touch section is radially movable from an initial position. The outer region is set at the periphery of the touch section and has a pattern where at least either recesses or protrusions are arranged. The inner region is set inside the outer region on the upper surface of the touch section, and has a pattern where at least either recesses or protrusions are arranged. The pattern in the inner region is different from the pattern in the outer region. This input unit ensures that a pattern optimal for moving the thumb so as to radially move the touch section and a pattern optimal for moving the thumb so as to return the touch section to the initial position can be formed in each of the two regions. It should be noted that the above structure may be applied to the touch section having the periphery that is not swelling upward.

An example of a cover proposed by the present disclosure is detachable from the input unit. The cover includes an upper surface, an outer region, and an inner region. The upper surface has an upward-swelling periphery. The outer region is positioned outside the apex of the periphery, and has a pattern where at least either recesses or protrusions are regularly arranged. The inner region is positioned inside the apex of the periphery, and has a pattern where at least either recesses or protrusions are regularly arranged. This cover enables the force of a finger of a user to smoothly act on the touch section no matter whether the finger radially tilts the touch section or returns the touch section to the initial position.

Another example of the cover proposed by the present disclosure is detachable from the input unit. The cover includes an outer region and an inner region. The outer region is set at the periphery of the cover and has a pattern where at least either recesses or protrusions are arranged. The inner region is set inside the outer region and has a pattern where at least either recesses or protrusions are arranged. The pattern in the inner region is different from the pattern in the outer region. This cover ensures that a pattern optimal for moving the thumb so as to radially move the touch section and a pattern optimal for moving the thumb so as to return the touch section to the initial position can be formed in each of the two regions. It should be noted that the above structure may be applied to the cover provided with the upper surface having the periphery that is not swelling upward.

BRIEF DESCRIPTION OF DRAWINGS

FIG. 11 is a cross-sectional view illustrating a cover proposed by the present disclosure.

DESCRIPTION OF EMBODIMENT

Figure 1:
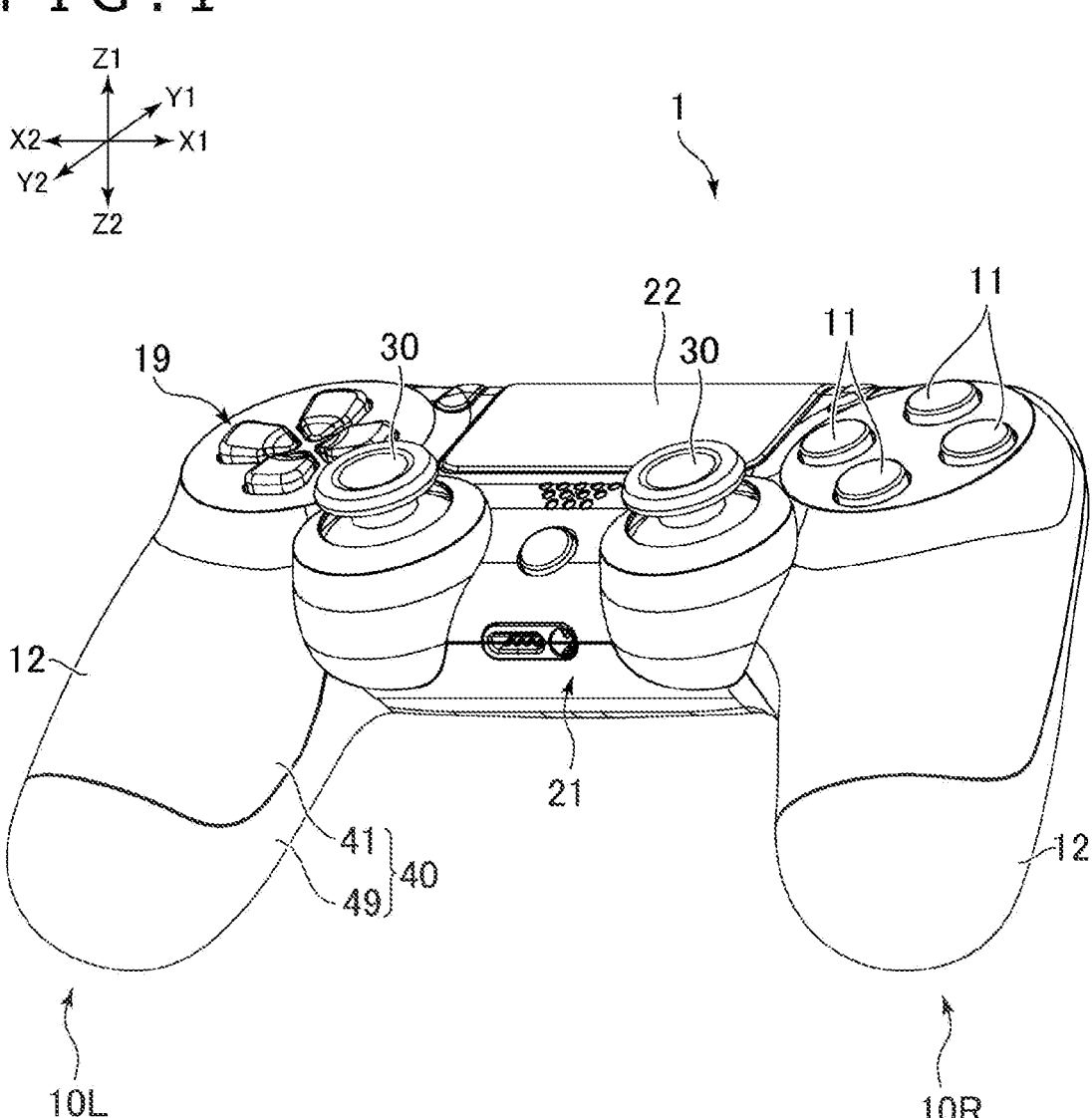
FIG. 1 is a perspective view illustrating an input device proposed by the present disclosure.

An example of an input device proposed by the present disclosure will now be described. FIG. 1 is a perspective view illustrating the example of the input device. In the following description, Y1 and Y2 depicted in FIG. 1 indicate the forward direction and the backward direction, respectively. Further, X1 and X2 indicate the rightward direction and the leftward direction, respectively. Furthermore, Z1 and Z2 indicate the upward direction and the downward direction, respectively.

The input device 1 is used as an input device for an information processing apparatus having, for example, a game program execution function, a video reproduction function, and a communication function exercised through the Internet. A signal based on an operation performed on the input device 1 by a user is wiredly or wirelessly transmitted to the information processing apparatus by the input device 1. For example, various sensors (an acceleration sensor, a gyroscope sensor, etc.) for detecting the posture and motion of the input device 1 and a battery are built in the input device 1. The input device 1 additionally transmits the outputs of the sensors to the information processing apparatus.

In the example depicted in FIG. 1, the input device 1 includes left and right holders 10L and 10R that are disposed on its left and right sections, respectively. The user holds the left and right holders 10L and 10R with the user's left and right hands, respectively. A central section 21 is disposed between the front sections of the holders 10L and 10R. The rear sections of the holders 10L and 10R are each provided with a grip 12. The grip 12 is extended rearward from the rear surface of the central section 21.

A plurality of input members are disposed on the upper surfaces of the front sections of the holders 10L and 10R and are configured to be operated by the user. A plurality of operation buttons 11 are disposed, for example, on the upper surface of the front section of the right holder 10R. For example, four operation buttons 11 are positioned at the ends of a cross. Further, cross-shaped direction keys 19 are disposed on the upper surface of the front section of the left holder 10L.

As illustrated in FIG. 1, the input device 1 includes a cabinet 40. The cabinet 40 is configured to form the outer surface of the input device 1 and accommodate various parts included in the input device 1. The cabinet 40 in the example depicted in FIG. 1 includes an upper cabinet half body 41 and a lower cabinet half body 49. The upper cabinet half body 41 and the lower cabinet half body 49 are vertically joined to each other.

As depicted in FIG. 1, the input device 1 includes an input member 22. The input member 22 is disposed on the upper surface of the central section 21 and shaped like a plate. The input member 22 includes a touch sensor for detecting the position of a finger brought into contact with the upper surface of the input member 22. Further, the input member 22 is supported in such a manner as to permit it to vertically move when depressed by the user. The input device 1 includes a switch for detecting a state where the input member 22 is depressed. The input member 22 functions as a button that is able to turn the switch on and off.

It should be noted that, unlike the example depicted in FIG. 1, the input device 1 may be configured to be held by one hand of the user. For example, the input device 1 may have a single rod-shaped grip. In such a case, the input device 1 does not need to include the abovementioned left and right holders 10L and 1OR and the central section 21.

<Input Stick>

The input device 1 is provided with an input unit that includes a touch section 32. The touch section 32 is radially movable from an initial position. The input unit includes earlier-mentioned left and right input sticks 30. The input stick 30 includes a prop 31 (see FIGS. 2A and 2B). The touch section 32 is disposed on the uppermost part of the prop 31. A finger of the user touches the touch section 32 to operate the input stick 30. The touch section 32 is disk-shaped and larger in outside diameter than the prop 31. The height (length) of the input stick 30 is greater than the height of the other input members (i.e., operation buttons 11 and direction keys 19) disposed on the upper surface of the holders 10L and 10R. The input stick 30 is, for example, radially tiltable from an initial position and is rotatable around the initial position while it is tilted. The input unit includes a support mechanism and a sensor at the base of the input stick 30. The support mechanism supports the input stick 30. The sensor outputs a signal based on the position (tilt angle and tilt direction) of the input stick 30. The input stick 30 includes a skirt 31a that is disposed on the lower part of the prop 31 to cover the support mechanism. The input device 1 transmits a signal based on the tilt angle and tilt direction to the information processing apparatus.

It should be noted that, instead of the depicted input stick 30, an input member having a radially slidable touch section may be used as an input member included in the input unit.

The touch section 32 is formed, for example, by resin such as polycarbonate or acrylonitrile butadiene styrene (ABS). The touch section 32 may be formed by two types of materials. For example, the outer surface of the touch section 32 (a portion in which a later-described recess/protrusion pattern is formed) may be formed by an elastic material such as rubber or elastomer while the internal portion of the touch section 32 is formed by resin such as polycarbonate or ABS. The position of the input stick 30 and the material of the input stick 30 are not limited to those described in conjunction with the example of the input device 1. For example, the input stick 30 may be positioned at the front of the holders 10L and 10R.

<Touch Section>

Figure 2A:
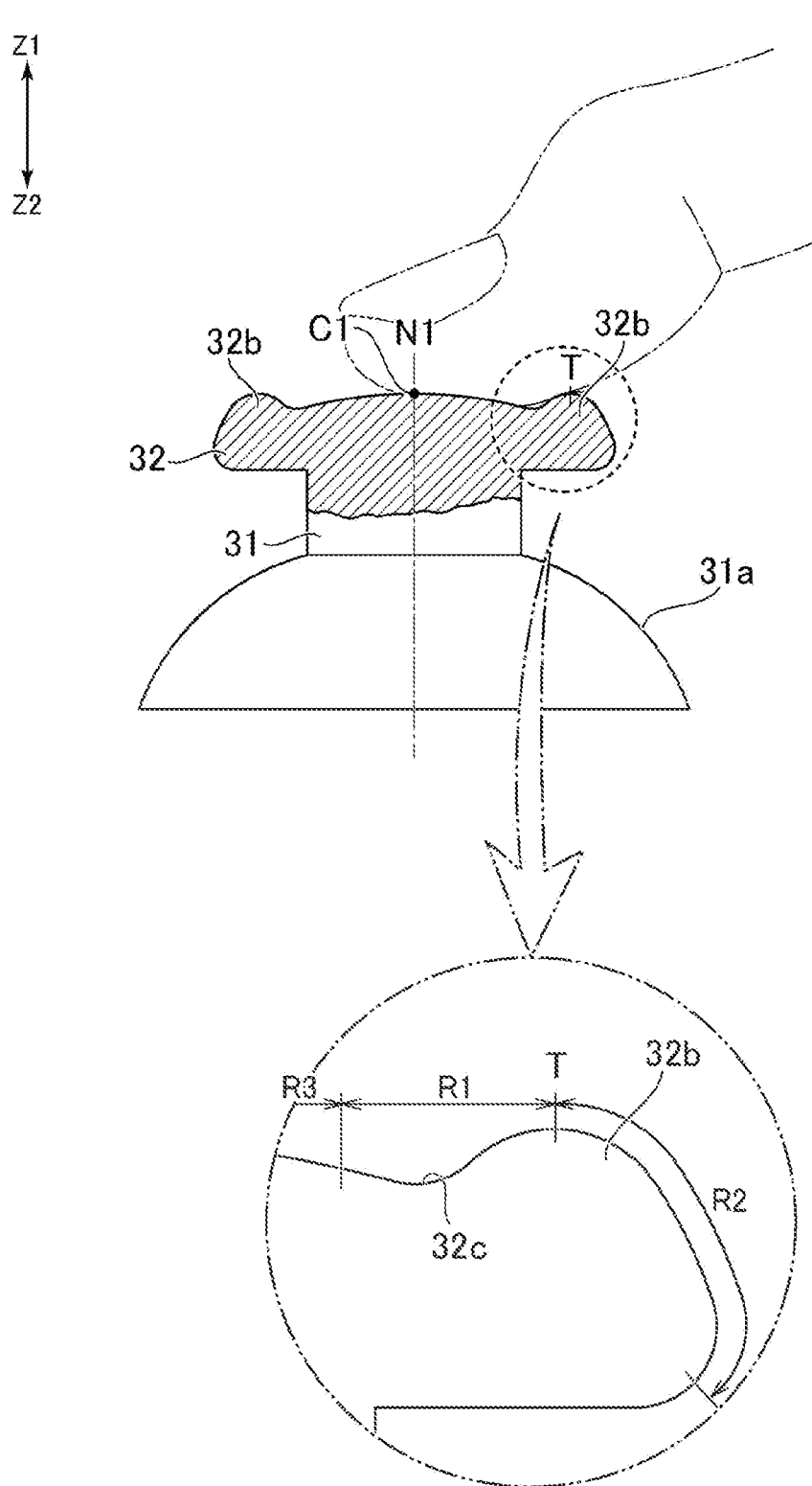
FIG. 2A is a cross-sectional view illustrating an input stick included in an example of an input unit.
Figure 2B:
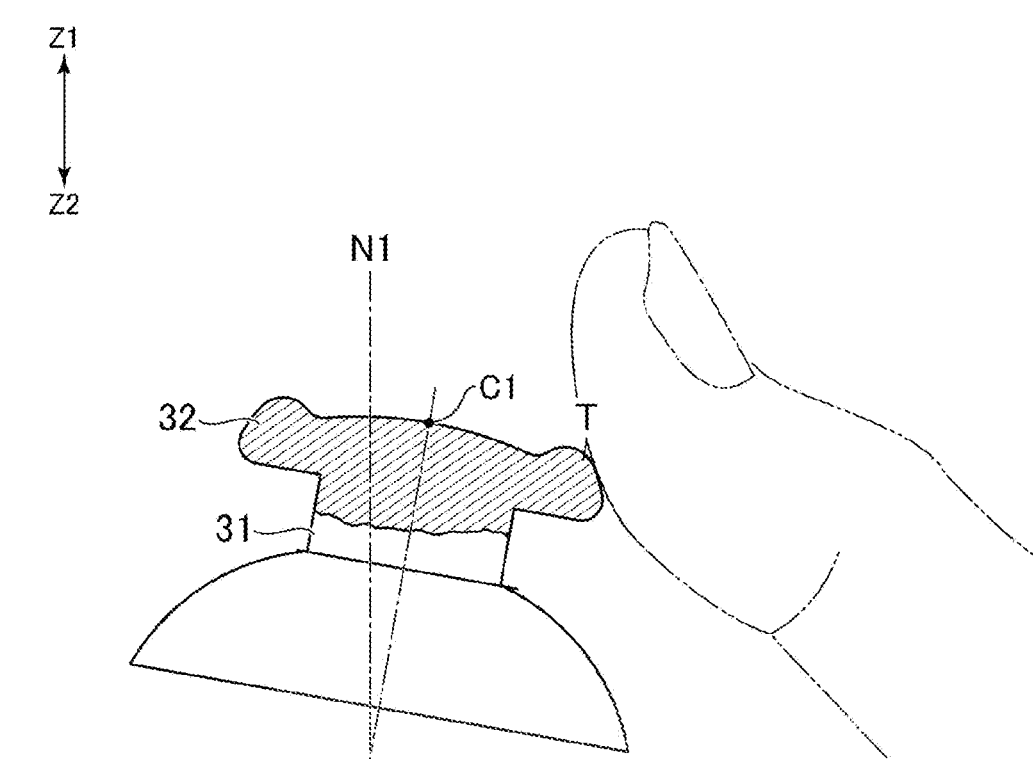
FIG. 2B is a cross-sectional view illustrating a state where the input stick depicted in FIG. 2A is radially tilted.

As illustrated in FIG. 2A, the upper surface of the touch section 32 has a periphery 32b that is swelling upward. When the input device 1 is viewed from above, the periphery 32b is ring-shaped around the center C1 of the upper surface of the input stick 30. When attempting to tilt the input stick 30, a thumb of the user becomes stuck in an inner region R1 that is set inside the apex T of the periphery 32b, and thus applies a force directed radially outward to the input stick 30. Conversely, when attempting to return the input stick 30 to the initial position as depicted in FIG. 2B, the thumb comes into contact with an outer region R2 (see FIG. 2A) that is set outside the apex T of the periphery 32b, and thus applies a force directed toward a vertical line N1 to the input stick 30.

In the above instance, the apex T is, for example, at the highest position on the upper surface of the periphery 32b of the touch section 32. The initial position of the input stick 30 provides, for example, a posture perpendicular to a surface on which the input stick 30 is disposed (the upper surface of the central section 21 of the input device 1). When the input stick 30 is in the initial position, the vertical line N1 passes through the center of the prop 31 of the input stick 30. The input device 1 may include or exclude a mechanism (e.g., a spring) for pressing the input stick 30 into the initial position.

Figure 3:
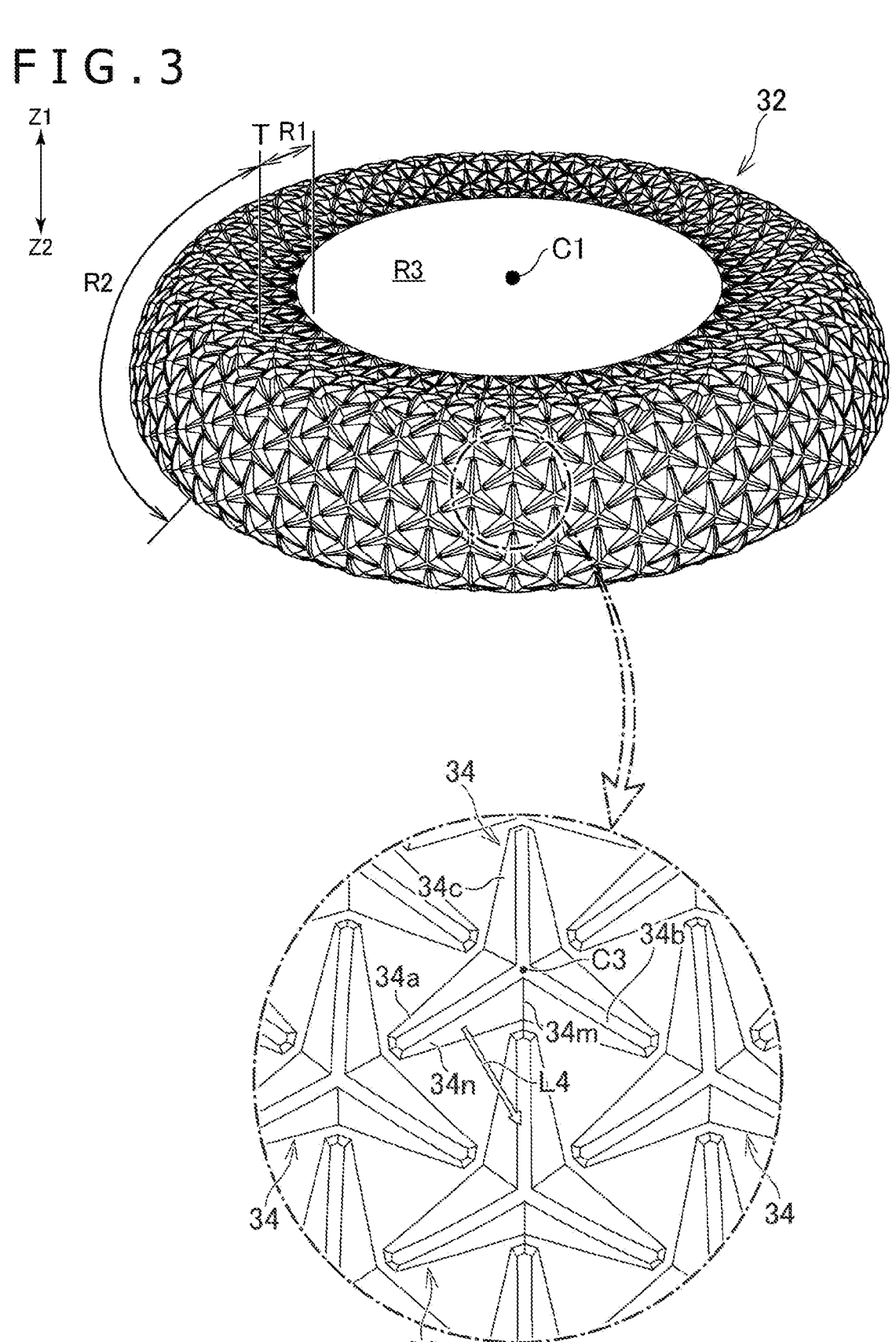
FIG. 3 is a perspective view illustrating a touch section that is disposed on the uppermost part of the input stick.
Figure 4:
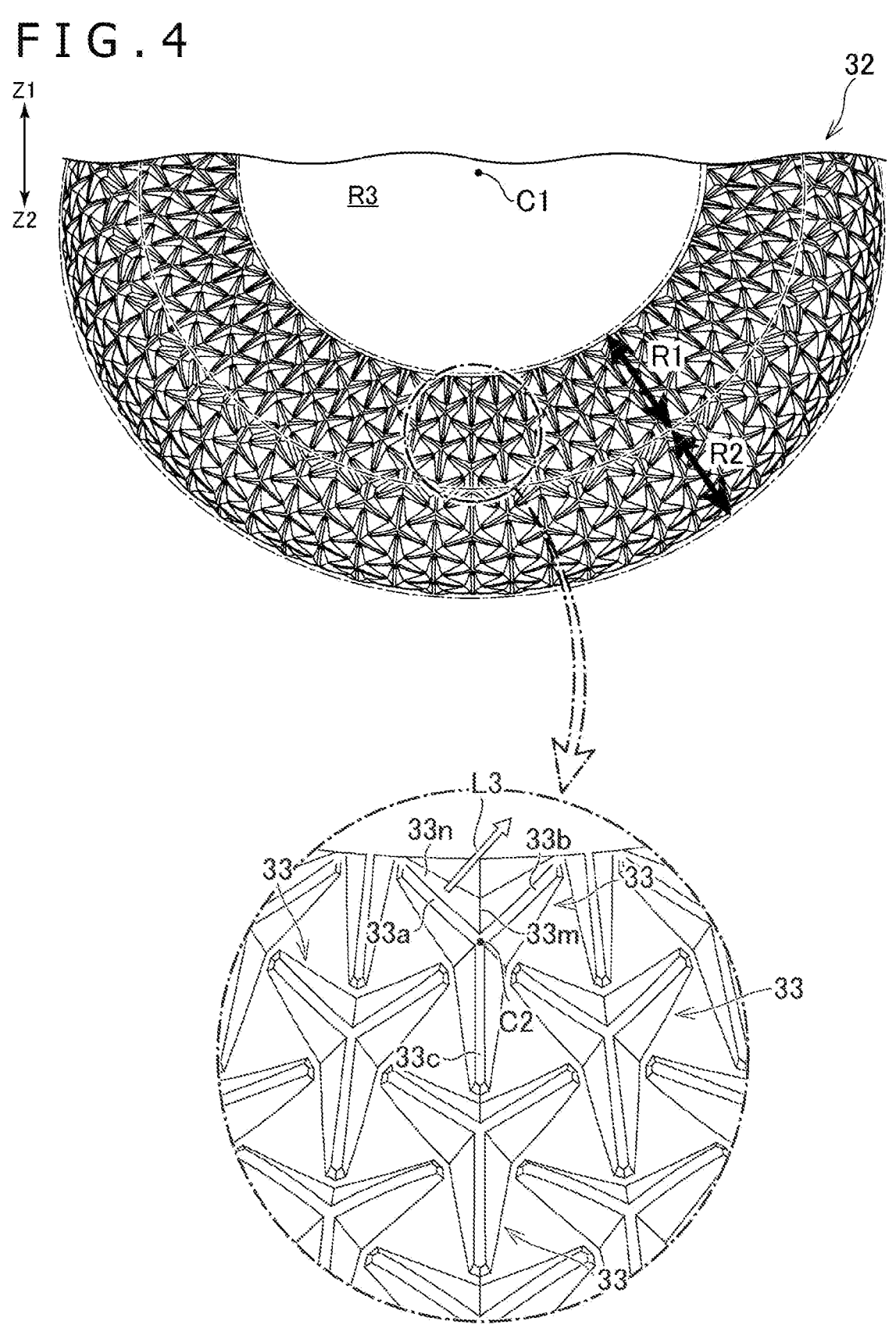
FIG. 4 is a plan view illustrating the touch section of the input stick.

The inner region R1 and the outer region R2 are both ring-shaped around the center of the upper surface of the touch section 32. As depicted in FIGS. 3 and 4, the outer region R2 and the inner region R1 may both have a pattern where at least either recesses or protrusions are regularly arranged. In a situation where the pattern is formed in both the outer region R2 and the inner region R1 as described above, the pattern executes an antiskid function so as to smoothly apply the force of the thumb to the input stick 30 no matter whether the thumb tilts the input stick 30 or returns the input stick 30 to the initial position. A state where "at least either recesses or protrusions are regularly arranged" denotes that a pattern unit formed by a single recess or protrusion is periodically repeated circumferentially and radially in the inner region R1 and is periodically repeated circumferentially and axially in the outer region R2. In the example of the input device 1, the pattern in the inner region R1 is formed along the whole circumference of the inner region R1, and the pattern in the outer region R2 is formed along the whole circumference of the outer region R2. Unlike the example of the input device 1, the pattern in the inner region R1 may be formed circumferentially along only a part of the inner region R1 (e.g., a part likely to be touched by a finger of the user with particularly high frequency). Similarly, the pattern in the outer region R2 may be formed circumferentially along only a part of the outer region R2 (e.g., a part likely to be touched by a finger of the user with particularly high frequency).

As depicted in FIG. 2A, a sloped surface whose height gradually increases toward the apex T of the periphery 32b is included in the inner region R1 where a recess/protrusion pattern is formed. The upper surface of the touch section 32 may include a region (referred to as the central region R3) that has no recess/protrusion pattern and is positioned inside the inner region R1. Further, unlike the example of the input stick 30, the recess/protrusion pattern may be formed in the central region R3. The central region R3 is curved in such a manner that the central region R3 is highest at the center C1 of the upper surface.

Furthermore, in the example depicted in FIG. 2A, the upper surface of the touch section 32 includes a recess 32c (see FIG. 2A) that is positioned inside the periphery 32b. The inner region R1 where a recess/protrusion pattern is formed is extended to the inside of the lowest part of the recess 32c. Moreover, the outer region R2 where a recess/protrusion pattern is formed is extended not only to the upper surface of the touch section 32 but also to the side surface of the touch section 32.

<Pattern>

The pattern formed in the outer region R2 and the pattern formed in the inner region R1 are preferably different from each other. More specifically, the outer region R2 and the inner region R1 are preferably different in at least one of shape, size, and posture of each recess or protrusion included in the patterns (each protrusion and each recess are both referred to as the pattern unit). When the above-described configuration is adopted, a pattern suitable for moving the thumb so as to radially tilt the input stick 30 and a pattern suitable for moving the thumb so as to return the input stick 30 to the initial position can be formed in each of the two regions R1 and R2.

An appropriate pattern in the inner region R1 is a pattern effective for preventing the thumb from skidding when the thumb radially tilts the input stick 30. As the appropriate pattern described above, a pattern having a standing surface (e.g., a standing surface 33n of a later-described protrusion 33) is used. The standing surface is a part of the outer surface of a protrusion formed in the inner region R1 or a part of the inner surface of a recess formed in the inner region R1, and is a surface facing the inside of the inner region R1. The standing surface is positioned, for example, at an angle of at least 30 degrees from a surface along the front surface of the touch section 32 (e.g., the sloped surface whose height gradually increases from the recess 32c to the apex T of the periphery 32b as depicted in FIG. 2A).

An appropriate pattern in the outer region R2 is a pattern effective for preventing the thumb from skidding when the thumb returns the input stick 30 to the initial position. As the appropriate pattern described above, a pattern having a standing surface (e.g., a standing surface 34n of a later-described protrusion 34) is used. The standing surface is a part of the outer surface of a protrusion formed in the outer region R2 or a part of the inner surface of a recess formed in the outer region R2, and is a surface facing opposite the inner region R1. The standing surface is positioned, for example, at an angle of at least 30 degrees from a surface along the front surface of the touch section 32 (e.g., a curved surface that descends from the apex T of the periphery 32b while curving and that is depicted in FIG. 2A).

As depicted in FIG. 4, the pattern formed in the inner region R1 has a plurality of protrusions 33 (the protrusions 33 are hereinafter referred to as the inner protrusions). Each inner protrusion 33 is substantially shaped like the letter Y, and includes a first protrusion part 33a, a second protrusion part 33b, and a third protrusion part 33c. The first protrusion part 33a, the second protrusion part 33b, and the third protrusion part 33c are extended in three respective directions from the center C2 of the inner protrusion 33. As depicted in FIG. 4, the thickness of each of the protrusion parts 33a, 33b, and 33c may gradually decrease toward their respective tips. As depicted in FIG. 3, the pattern formed in the outer region R2 has a plurality of protrusions 34 (the protrusions 34 are hereinafter referred to as the outer protrusions). Each outer protrusion 34 is substantially shaped like the letter Y, and includes a first protrusion part 34a, a second protrusion part 34b, and a third protrusion part 34c. The first protrusion part 34a, the second protrusion part 34b, and the third protrusion part 34c are extended in three respective directions from the center C3 of the outer protrusion 34. As depicted in FIG. 3, the thickness of each of the protrusion parts 34a, 34b, and 34c may also gradually decrease toward their respective tips. In the regions R1 and R2, portions other than the protrusions 33 and 34 and later-described intermediate protrusions 35 are relatively recessed. That is, a pattern containing protrusions and recesses is formed in both the inner region R1 and the outer region R2.

The first protrusion part 33a and second protrusion part 33b of the inner protrusion 33 are respectively formed at approximately the 10 and 2 o'clock positions relative to the center C2. Meanwhile, the first protrusion part 34a and second protrusion part 34b of the outer protrusion 34 are respectively formed at approximately the 8 and 4 o'clock positions relative to the center C3. That is, the protrusions 33 and 34 differ in posture (orientation) although they have substantially the same shape. More specifically, the posture (orientation) of the outer protrusion 34 and the posture (orientation) of the inner protrusion 33 are symmetrical with respect to a plane orthogonal to the vertical line N1.

Instead of differing in pattern unit orientation, the pattern unit (i.e., each protrusion and each recess) of the outer region R2 and the pattern unit of the inner region R1 may differ in pattern unit shape and/or pattern unit size.

As depicted in FIG. 4, the first protrusion part 33a and the second protrusion part 33b have the standing surface 33n that faces the inside of the inner region R1. A state where "the standing surface 33n faces the inside of the inner region R1" denotes that the perpendicular line (see a line L3 in FIG. 4) of the standing surface 33n is directed toward the inside in the radial direction when the standing surface 33n is viewed orthogonally to the outer surface of the touch section 32. In the example depicted in FIG. 4, the perpendicular line L3 of the standing surface 33n is directed diagonally to the radial direction. When coming into contact with the inner region R1 in order to tilt the input stick 30, the thumb becomes stuck on the standing surface 33n. This results in effectively inhibiting the thumb from skidding.

Particularly, when the touch section 32 is viewed from above, the standing surface 33n is substantially shaped like the letter V that is open toward the inside of the inner region R1. That is, the standing surface 33n is bent and recessed at the center 33m of the standing surface 33n. This results in more effectively inhibiting the thumb from skidding. The shape of the standing surface 33n is not limited to the above-described one. The standing surface 33n may be substantially shaped like the letter U that is open toward the inside of the inner region R1. Further, the angle of the standing surface 33n (the angle from the upper surface of the touch section 32 on which the standing surface 33n is formed) may be perpendicular or diagonal to the upper surface as long as the thumb becomes stuck.

The inner protrusion 33 includes the third protrusion part 33c, which is extended radially outward from the standing surface 33n (i.e., the protrusion parts 33a and 33b). This can inhibit the inner protrusion 33 from deforming when the thumb comes into contact with the inner region R1 in order to radially tilt the input stick 30.

Since the inner protrusion 33 is shaped as described above, the friction applied to the thumb attempting to move radially outward along the inner region R1 is greater than the friction applied to the thumb attempting to move in the opposite direction.

It should be noted that a recess may be formed as a pattern unit in the inner region R1. In such a case, a part of the inner surface of the recess is able to function as a standing surface on which the thumb becomes stuck.

As depicted in FIG. 3, the first protrusion part 34a and second protrusion part 34b of the outer protrusion 34 have a standing surface 34n that faces opposite the inner region R1. A state where "the standing surface 34n faces opposite the inner region R1" denotes that the perpendicular line (see a line L4 in FIG. 3) of the standing surface 34n is directed toward the underside or the outside in the radial direction when the standing surface 34n is viewed orthogonally to the outer surface of the touch section 32. In the example depicted in FIG. 3, the perpendicular line L4 of the standing surface 33n is directed diagonally downward. When returning the input stick 30 to the initial position, the thumb comes into contact with the outer region R2 and becomes stuck on the standing surface 34n. This can effectively inhibit the thumb from skidding.

Particularly, the standing surface 34n is substantially shaped like the letter V that is open opposite the inner region R1. That is, the standing surface 34n is bent and recessed at the center 34m of the standing surface 34n. This can more effectively inhibit the thumb from skidding. The shape of the standing surface 34n is not limited to the above-described one. The standing surface 34n may be substantially shaped like the letter U that is open downward or radially outward from the center C1 of the touch section 32. Further, the angle of the standing surface 34n (the angle from the upper or side surface of the touch section 32 on which the standing surface 34n is formed) may be perpendicular or diagonal to such an upper or side surface as long as the thumb becomes stuck.

The outer protrusion 34 includes the third protrusion part 34c, which is extended toward the center C1 from the standing surface 34n (i.e., the protrusion parts 34a and 34b). This can inhibit the outer protrusion 34 from deforming when the thumb comes into contact with the outer region R2 in order to return the input stick 30 to the initial position.

Since the outer protrusion 34 is shaped as described above, the friction applied to the thumb attempting to move toward the center C1 of the touch section 32 along the outer region R2 is greater than the friction applied to the thumb attempting to move in the opposite direction.

It should be noted that a recess may be formed as a pattern unit in the outer region R2. In such a case, a part of the inner surface of the recess is able to function as a standing surface on which the thumb becomes stuck.

In the outer region R2, as depicted in FIG. 3, the end of the first protrusion part 34a is close to the neighboring outer protrusion 34 (more specifically, a portion between the first protrusion part 34a and third protrusion part 34c of the neighboring outer protrusion 34). Similarly, the end of the second protrusion part 34b is close to the neighboring outer protrusion 34, and the end of the third protrusion part 34c is close to the neighboring outer protrusion 34. This results in increasing the density of the outer protrusion 34 and can effectively inhibit the thumb from skidding.

Additionally, in the inner region R1, as depicted in FIG. 4, the end of the first protrusion part 33a is close to the neighboring inner protrusion 33 (more specifically, a portion between the first protrusion part 33a and third protrusion part 33c of the neighboring inner protrusion 33). Similarly, the end of the second protrusion part 33b is close to the neighboring inner protrusion 33, and the end of the third protrusion part 33c is close to the neighboring inner protrusion 33. This can increase the density of the inner protrusion 33 and thus effectively inhibit the thumb from skidding.

<Intermediate Protrusion>

Figure 5:
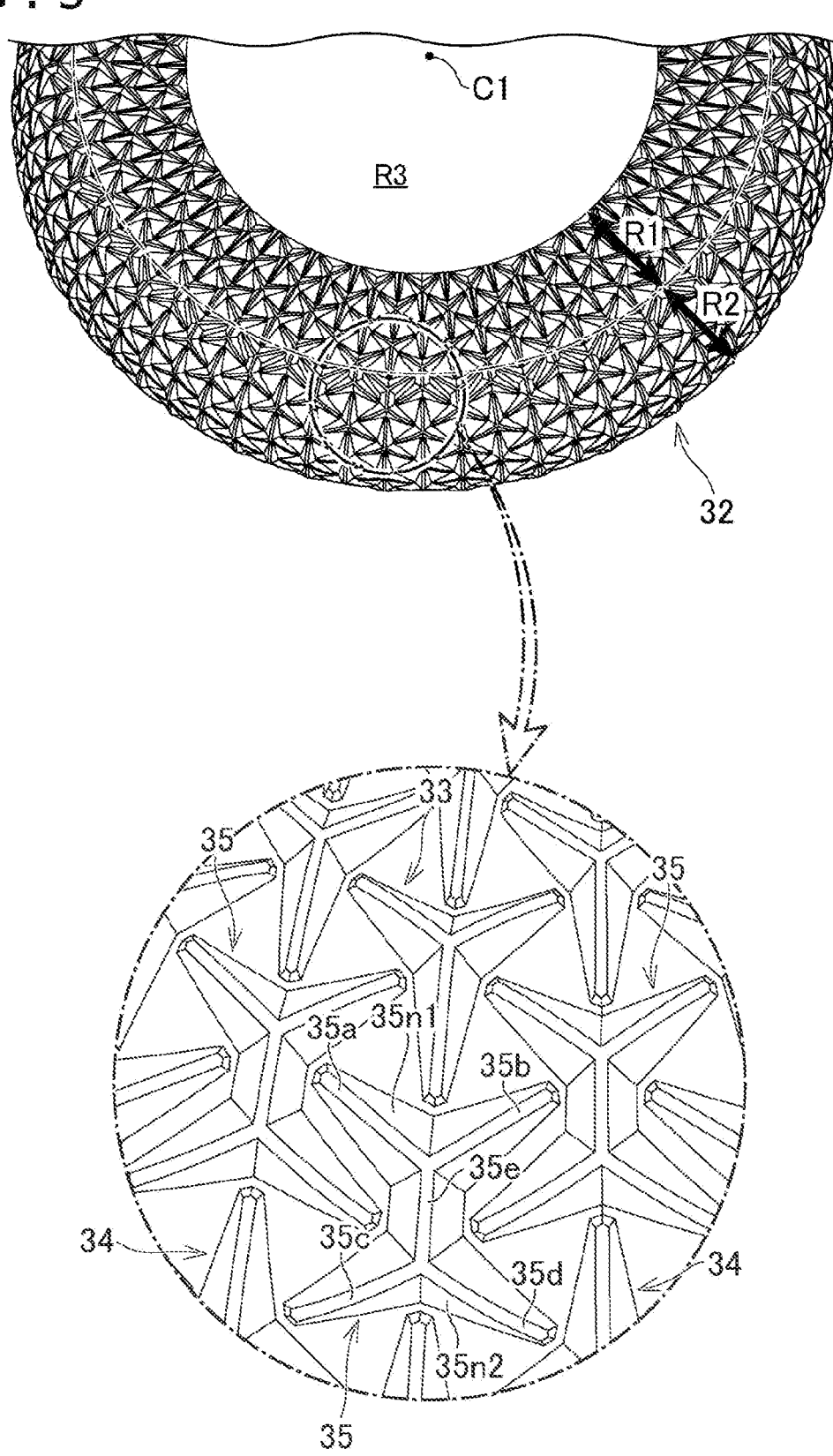
FIG. 5 is a perspective view illustrating the touch section of the input stick as viewed from diagonally above.

As depicted in FIG. 5, the touch section 32 includes a plurality of protrusions 35 that are spread across the inner region R1 and the outer region R2 (the protrusions 35 are hereinafter referred to as the intermediate protrusions). Each intermediate protrusion 35 has a standing surface 35n1 and a standing surface 35n2. The standing surface 35n1 corresponds to the standing surface 33n of the inner protrusion 33, whereas the standing surface 35n2 corresponds to the standing surface 34n of the outer protrusion 34.

More specifically, the standing surface 35n1 is a surface facing the inside of the inner region R1. When radially tilting the input stick 30, the thumb becomes stuck also on the standing surface 35n1. In this manner, the standing surface 35n1 can inhibit the thumb from skidding. Meanwhile, the standing surface 35n2 faces opposite the inner region R1. When returning the input stick 30 to the initial position, the thumb becomes stuck also on the standing surface 35n2. In this manner, the standing surface 35n2 can inhibit the thumb from skidding.

The intermediate protrusion 35 is substantially shaped like a combination of the two letters Y facing in opposite directions. That is, the intermediate protrusion 35 includes a first protrusion part 35a, a second protrusion part 35b, a third protrusion part 35c, a fourth protrusion part 35d, and a joint protrusion part 35e. One end of the joint protrusion part 35e is connected to a portion between the first protrusion part 35*a* and the second protrusion part 35*b*. The first protrusion part 35*a* and the second protrusion part 35*b* are respectively formed at approximately the 10 and 2 o'clock positions relative to one end of the joint protrusion part 35*e*. The other end of the joint protrusion part 35*e* is connected to a portion between the third protrusion part 35*c* and the fourth protrusion part 35*d*. The third protrusion part 35*c* and the fourth protrusion part 35*d* are respectively formed at approximately the 8 and 4 o'clock positions relative to the other end of the joint protrusion part 35*e*.

A plurality of intermediate protrusions 35 are circumferentially arranged around the center C1 of the touch section 32. The positions of two neighboring intermediate protrusions 35 overlap with each other in the circumferential direction of the touch section 32. That is, either one of the first protrusion part 35*a* or third protrusion part 35*c* of an intermediate protrusion 35 is positioned between the second protrusion part 35*b* and fourth protrusion part 35*d* of a neighboring intermediate protrusion 35. Similarly, either one of the second protrusion part 35*b* or fourth protrusion part 35*d* of the intermediate protrusion 35 is positioned between the first protrusion part 35*a* and third protrusion part 35*c* of the opposite neighboring intermediate protrusion 35. This results in increasing the density of the intermediate protrusions 35 and can more effectively inhibit the thumb from skidding.

<Modifications>

The input stick proposed by the present disclosure is not limited to the input stick 30 described thus far. FIGS. 6 to 10 are diagrams illustrating other examples of the input stick proposed by the present disclosure.

FIGS. 6 to 10 illustrate touch sections 132 to 532, respectively, as examples of the touch section of the input stick proposed by the present disclosure. The upper surfaces of the touch sections 132 to 532 have upward-swelling peripheries 132*b* to 532*b*, respectively, as is the case with the upper surface of the touch section 32. Further, as is the case with the outer surface of the touch section 32, the outer surfaces of the touch sections 132 to 532 each have the inner region R1 (see FIG. 2A), which is set inside the apex T of each of the peripheries 132*b* to 532*b*, and the outer region R2 (see FIG. 2A), which is set outside the apex T. The touch sections 132 to 532 each have a common recess/protrusion pattern in both the inner region R1 and the outer region R2.

Figure 6:
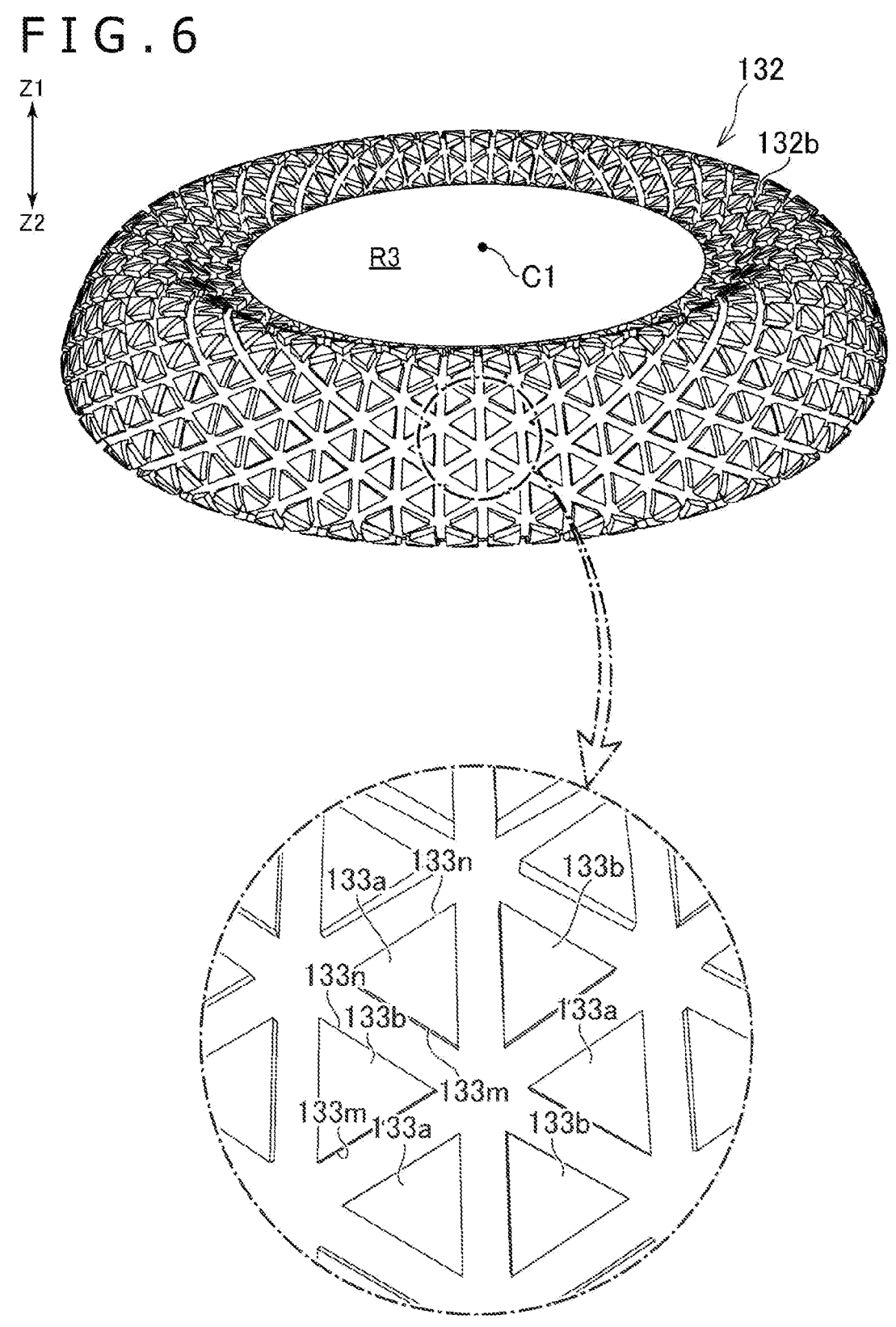
FIG. 6 is a perspective view illustrating a modification of a pattern formed in the touch section of the input stick.

FIG. 6 illustrates the touch section 132 as a modification of the touch section of the input stick proposed by the present disclosure. The touch section 132 has a plurality of protrusions 133*a* and 133*b*. The protrusions 133*a* and 133*b* are each shaped like a triangle, and a total of six protrusions 133*a* and 133*b* form a hexagonal set. The protrusions 133*a* and 133*b* each have a standing surface 133*n* that is formed diagonally toward the inside of the inner region R1. Further, the protrusions 133*a* and 133*b* each have a standing surface 133*m* that is formed diagonally opposite to the inner region R1. When radially tilting the input stick 30, the thumb comes into contact with the inner region R1 and becomes stuck on the standing surface 133*n* of the protrusions 133*a* and 133*b* formed in the inner region R1. Further, when returning the input stick 30 to the initial position, the thumb comes into contact with the outer region R2 and becomes stuck on the standing surface 133*m* of the protrusions 133*a* and 133*b* formed in the outer region R2.

Figure 7:
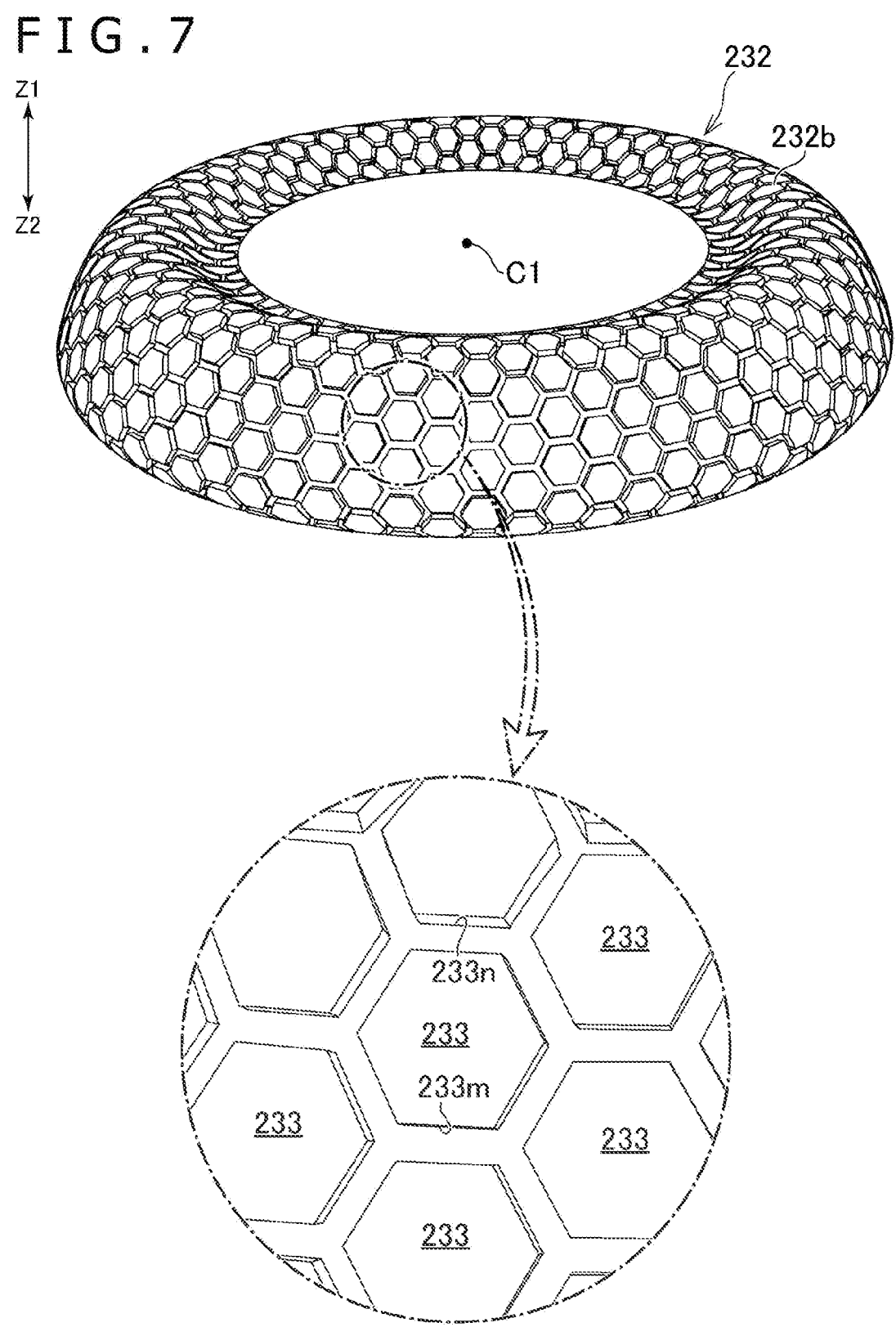
FIG. 7 is a perspective view illustrating another modification of the pattern formed in the touch section of the input stick.

FIG. 7 illustrates a touch section 232 as a modification of the touch section of the input stick proposed by the present disclosure. The touch section 232 has a plurality of protrusions 233. Each of the protrusions 233 is shaped like a hexagon, and has a standing surface 233*n* that faces the inside of the inner region R1. Further, the protrusions 233 each have a standing surface 233*m* that faces opposite the inner region R1. When radially tilting the input stick 30, the thumb comes into contact with the inner region R1 and becomes stuck on the standing surface 233*n* of the protrusions 233 formed in the inner region R1. Further, when returning the input stick 30 to the initial position, the thumb comes into contact with the outer region R2 and becomes stuck on the standing surface 233*m* of the protrusions 233 formed in the outer region R2.

Figure 8:
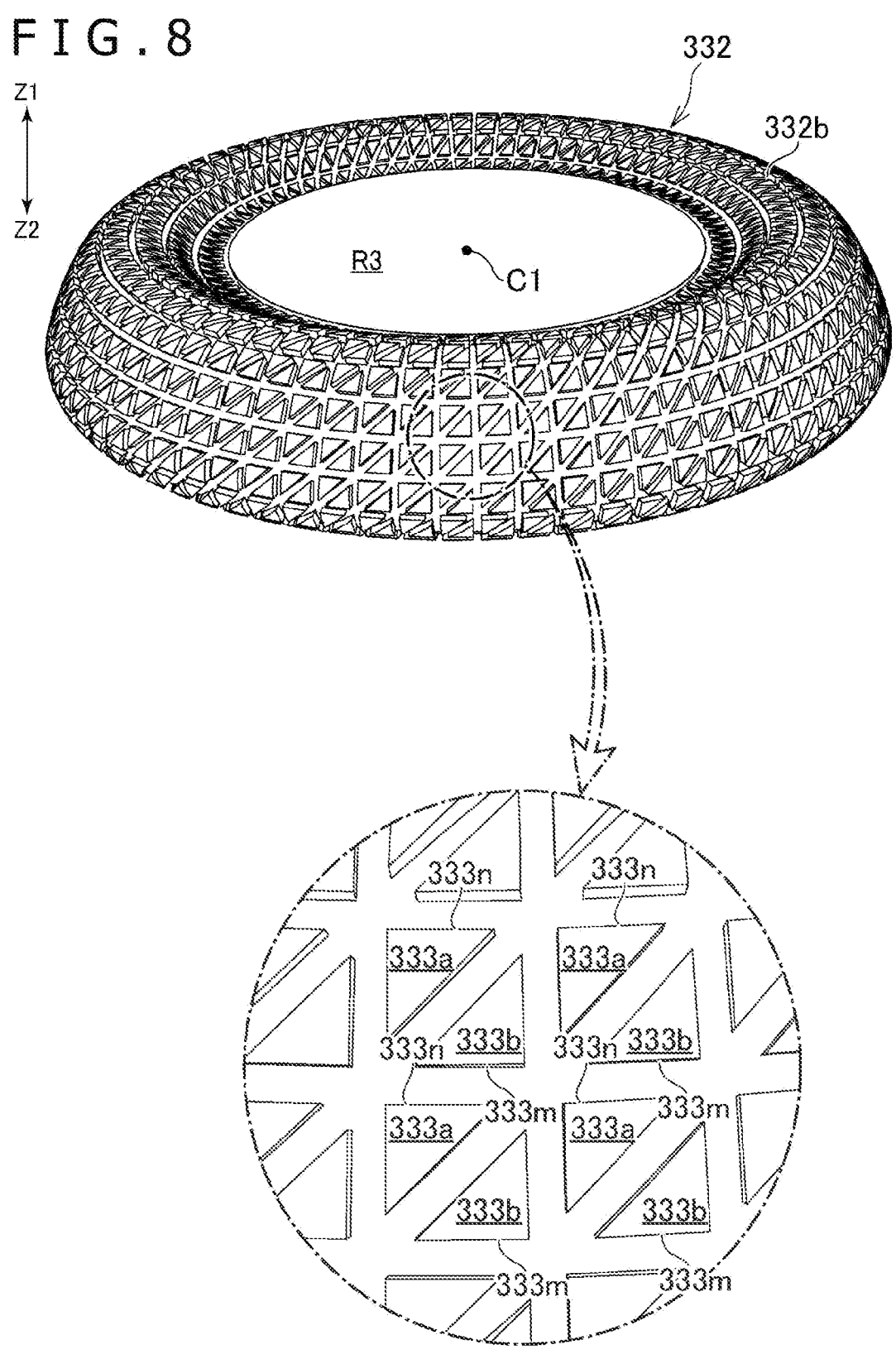
FIG. 8 is a perspective view illustrating yet another modification of the pattern formed in the touch section of the input stick.

FIG. 8 illustrates a touch section 332 as a modification of the touch section of the input stick proposed by the present disclosure. The touch section 332 has a plurality of protrusions 333*a* and 333*b*. The protrusions 333*a* and 333*b* are each shaped like a right triangle. The protrusions 333*a* each have a standing surface 333*n* that faces the inside of the inner region R1. The protrusions 333*b* each have a standing surface 333*m* that faces opposite the inner region R1. When radially tilting the input stick 30, the thumb comes into contact with the inner region R1 and becomes stuck on the standing surface 333*n* of the protrusions 333*a* formed in the inner region R1. Further, when returning the input stick 30 to the initial position, the thumb comes into contact with the outer region R2 and becomes stuck on the standing surface 333*m* of the protrusions 333*b* formed in the outer region R2.

Figure 9:
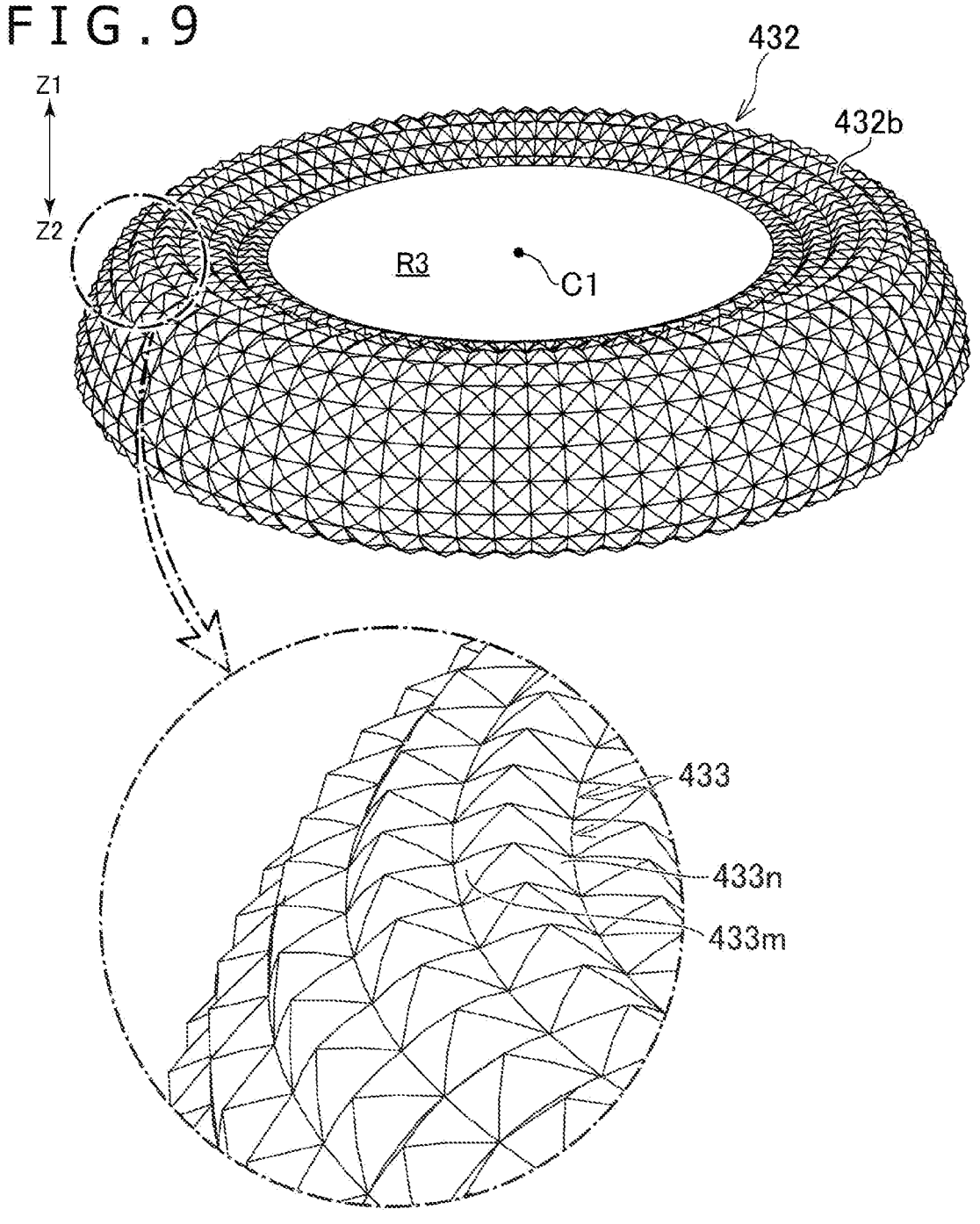
FIG. 9 is a perspective view illustrating still another modification of the pattern formed in the touch section of the input stick.

FIG. 9 illustrates a touch section 432 as a modification of the touch section of the input stick proposed by the present disclosure. The touch section 432 has a plurality of protrusions 433. The protrusions 433 are each quadrilateral in shape when viewed orthogonally to the outer surface of the touch section 432. Each of the protrusions 433 is shaped like a quadrangular pyramid and has a sloped surface 433*n* and a sloped surface 433*m*. When radially tilting the input stick 30, the thumb comes into contact with the inner region R1 and becomes stuck on the sloped surface 433*n* of the protrusions 433 formed in the inner region R1. Further, when returning the input stick 30 to the initial position, the thumb comes into contact with the outer region R2 and becomes stuck on the sloped surface 433*m* of the protrusions 433 formed in the outer region R2.

Figure 10:
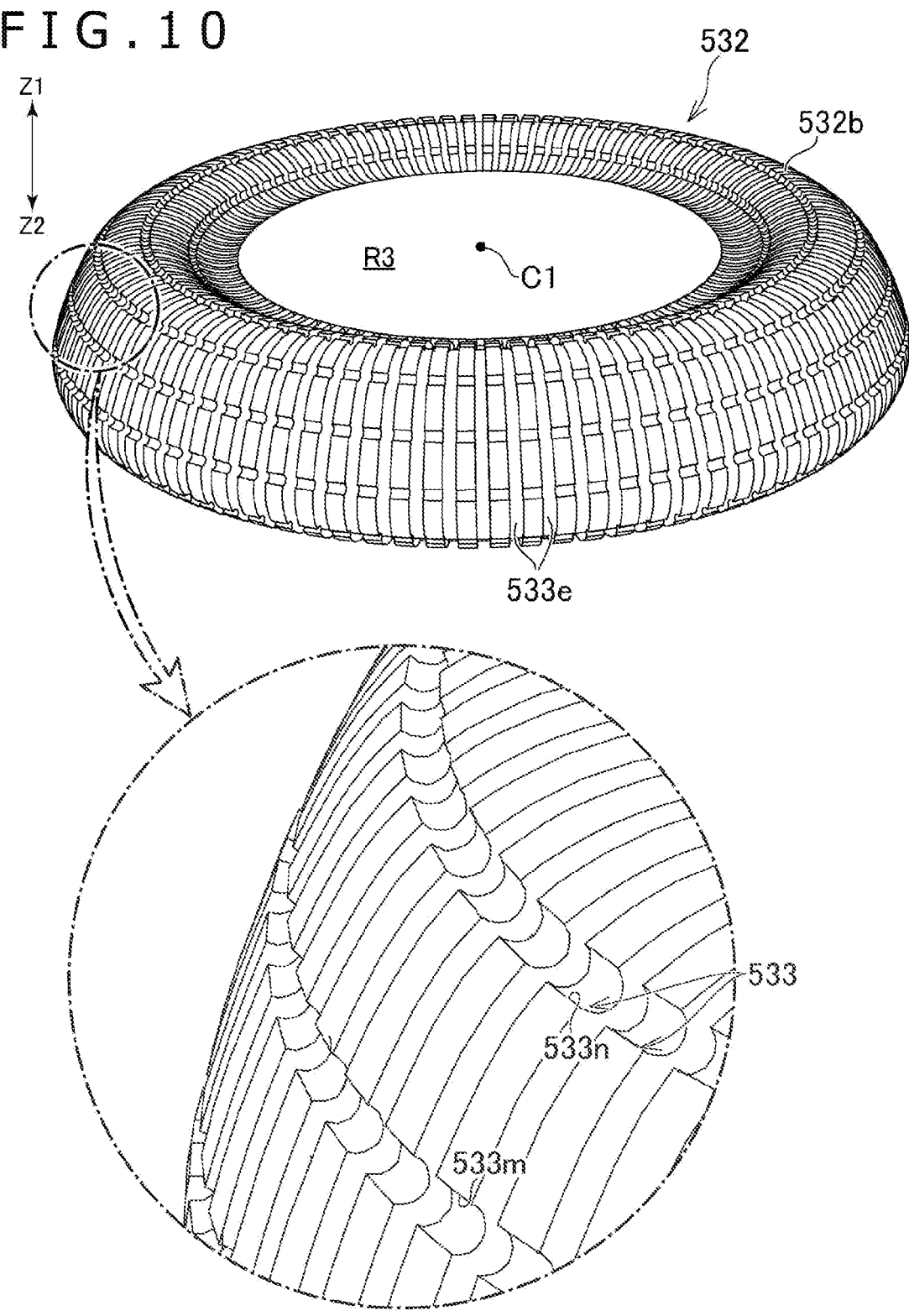
FIG. 10 is a perspective view illustrating an additional modification of the pattern formed in the touch section of the input stick.

FIG. 10 illustrates a touch section 532 as a modification of the touch section of the input stick proposed by the present disclosure. The touch section 532 has a plurality of protrusions 533. The protrusions 533 are each shaped like an elongated rectangle when viewed orthogonally to the outer surface of the touch section 432. The protrusions 533 each have a standing surface 533*n* and a standing surface 533*m*. The standing surface 533*n* faces the inside of the inner region R1, whereas the standing surface 533*m* faces opposite the inner region R1. When radially tilting the input stick 30, the thumb comes into contact with the inner region R1 and becomes stuck on the standing surface 533*n* of the protrusions 533 formed in the inner region R1. Further, when returning the input stick 30 to the initial position, the thumb comes into contact with the outer region R2 and becomes stuck on the standing surface 533*m* of the protrusions 533 formed in the outer region R2. The plurality of protrusions 533 form columns that are extended radially outward from the center C1 of the touch section 532. A groove 533*e* is formed between two adjacent columns.

<Conclusion>

As described above, the input stick 30 includes the touch sections 32 and 132 to 532 that are disposed on the uppermost part of the input stick 30 and are to be touched by a finger of the user. The upper surface of the touch section 32 has the upward-swelling peripheries 32*b* and 132*b* to 532*b*.

The touch sections 32 and 132 to 532 include the outer region R2 and the inner region R1. The outer region R2 is disposed outside the apex T of the periphery and has a pattern where at least either recesses or protrusions are regularly arranged. The inner region R1 is disposed inside the apex T of the periphery and has a pattern where at least either recesses or protrusions are regularly arranged. Because of the above-described structure, when the thumb radially tilts the input stick 30, the thumb comes into contact with the inner region R1 and becomes stuck on the pattern in the inner region R1. Further, when the thumb returns the input stick 30 to the initial position, the thumb comes into contact with the outer region R2 and becomes stuck on the pattern in the outer region R2. This ensures that the force of the thumb is smoothly applied to the input stick 30 no matter whether the thumb radially tilts the input stick 30 or returns the input stick 30 to the initial position.

Furthermore, the touch section 32 includes the outer region R2, which is set at the periphery of the touch section 32 and has a pattern where at least either recesses or protrusions are arranged, and the inner region R1, which is set inside the outer region R2 and has a pattern where at least either recesses or protrusions are arranged. The pattern in the inner region R1 and the pattern in the outer region R2 differ from each other. Since the above-described configuration is adopted, a pattern suitable for moving the thumb so as to radially tilt the input stick 30 (i.e., a pattern effective for preventing the thumb from skidding when the thumb radially tilts the input stick 30) and a pattern suitable for moving the thumb so as to return the input stick 30 to the initial position (i.e., a pattern effective for preventing the thumb from skidding when the thumb returns the input stick 30 to the initial position) can be formed in each of the two regions R1 and R2. It should be noted that the above-described structure may be applied to the touch section whose periphery 32b is not swelling upward.

The above-described structure of the touch section 32 and 132 to 532 may be applied to a radially slidable input member instead of the input stick 30. The radially slidable input member may be applied not only to an input member slidable in all 360-degree directions but also to an input member slidable in two orthogonal directions (in cross directions). Further, in another example, the above-described patterns may be formed circumferentially along only a part of the inner region R1 and/or formed circumferentially along only a part of the outer region R2.

<Cover>

Figure 11:
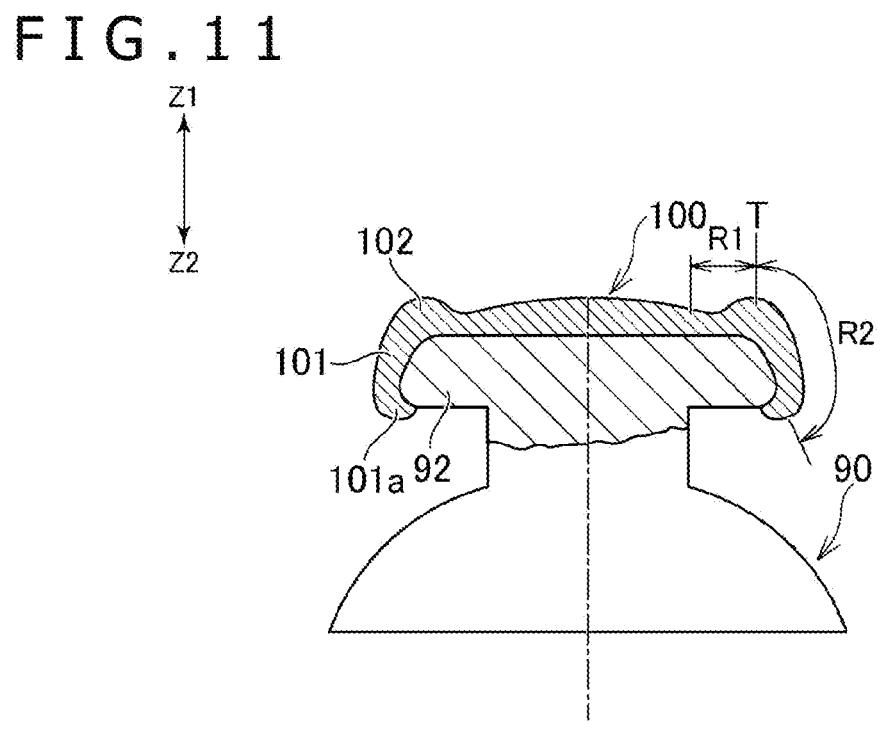

Moreover, the recess/protrusion pattern formed in the inner region R1 and the outer region R2 may be applied to a cover detachable from the touch section of the input unit instead of the input device itself. As an example of such a cover, a cover 100 is illustrated in FIG. 11.

The cover 100 is formed so as to cover a touch section 92 of an input stick 90. The cover 100 is formed by an elastic material such as rubber or elastomer. The cover 100 has a lateral section 101 that descends along the outer circumferential surface of the touch section 92. A rim 101a of the lateral section 101 can be hooked on the lower surface of the touch section 92. The user is able to remove the cover 100 from the touch section 92 by widening the lateral section 101.

A periphery 102 of the upper surface of the cover 100 is swelling upward. The cover 100 includes the outer region R2, which is set outside the apex T of the periphery 102 and has a pattern where at least either recesses or protrusions are regularly arranged, and the inner region R1, which is set inside the apex T of the periphery 102 and has a pattern where at least either recesses or protrusions are regularly arranged. The patterns formed in regions R1 and R2 may be the patterns formed in the regions R1 and R2 of the touch section 32 described with reference to FIGS. 3 to 5. The patterns formed in regions R1 and R2 may be the patterns formed in the regions R1 and R2 of the touch sections 132 to 532 described with reference to FIGS. 6 to 10.

Because of the above-described structure of the cover 100, when the thumb radially tilts the input stick 90, the thumb comes into contact with the inner region R1 and becomes stuck on the pattern in the inner region R1. Further, when the thumb returns the input stick 90 to the initial position, the thumb comes into contact with the outer region R2 and becomes stuck on the pattern in the outer region R2. This ensures that the force of a finger of the user is smoothly applied to the input stick 90 no matter whether the thumb radially tilts the input stick 90 or returns the input stick 90 to the initial position.

Furthermore, the patterns formed in the regions R1 and R2 of the cover 100 may differ from each other, as is the case, for example, with the touch section 32 described with reference to FIGS. 3 to 5. That is, the outer region R2 and inner region R1 of the cover 100 are preferably different in at least one of shape, size, and posture of each protrusion or recess (pattern unit) included in the patterns. When the above-described configuration is adopted, a pattern suitable for moving the thumb so as to radially tilt the input stick 90 (i.e., a pattern effective for preventing the thumb from skidding on the cover 100 when the thumb radially tilts the input stick 90) and a pattern suitable for moving the thumb so as to return the input stick 90 to the initial position (i.e., a pattern effective for preventing the thumb from skidding on the cover 100 when the thumb returns the input stick 90 to the initial position) can be formed in each of the two regions R1 and R2. It should be noted that the above-described structure may be applied to the cover whose periphery 102 is not swelling upward.

Moreover, the above-described structure of the cover 100 may be applied to a cover detachable from a radially slidable input member instead of a cover detachable from the input stick 90. In such a case, the structure of the cover 100 may be applied not only to a cover detachable from an input member slidable in all 360-degree directions, but also to a cover detachable from an input member slidable in two orthogonal directions (in cross directions). Additionally, in another example, the above-described patterns may be formed circumferentially along only a part of the inner region R1 and/or formed circumferentially along only a part of the outer region R2.

The invention claimed is:

1. An input unit comprising:
   a touch section that is provided with an upper surface that includes a disc-shaped central region and a ring-shaped upward-swelling periphery that extends from the disc-shaped central region,
   wherein a portion of the upper surface of the touch section that corresponds to an outer region of the ring-shaped upward-swelling periphery that is positioned outside an apex of the ring-shaped upward-swelling periphery has a regularly arranged pattern of recesses or protrusions, and
   wherein a portion of the upper surface of the touch section that corresponds to an inner region of the ring-shaped upward-swelling periphery that is positioned inside the apex of the ring-shaped upward-swelling periphery has a regularly arranged pattern of recesses or protrusions.

2. The input unit of claim 1, wherein the touch section is radially movable from an initial position.

3. The input unit of claim 1, wherein the regularly arranged pattern of the outer region is a same pattern as the regularly arranged pattern of the inner region.

4. The input unit of claim 1, wherein the regularly arranged pattern of the outer region is a different pattern as the regularly arranged pattern of the inner region.

5. The input unit of claim 1, wherein the touch section comprises a joystick of a video game controller.

6. The input unit of claim 1, wherein the touch section is disposed on an uppermost portion of a prop.

7. The input unit of claim 1, wherein an innermost portion of the touch section and an outermost portion of the touch section are made of different materials.

8. The input unit of claim 1, wherein the regularly arranged pattern associated with the outer region and the regularly arranged pattern associated with the inner region are anti-skid patterns.

9. The input unit of claim 1, wherein a portion of the upper surface of the touch section that corresponds to the disc-shaped central region is free of any patterns.

10. The input unit of claim 1, wherein the disc-shaped central region includes a raised center.

11. The input unit of claim 1, wherein the regularly arranged pattern of the outer region or the regularly arranged pattern of the inner region include U-shaped pattern units that are open toward the disc-shaped central region.

12. The input unit of claim 1, wherein the regularly arranged pattern of the outer region or the regularly arranged pattern of the inner region include V-shaped pattern units that are open toward the disc-shaped central region.

13. The input unit of claim 1, wherein one or more pattern units of each pattern has a variable thickness.

14. A method of manufacturing an input unit comprising:
providing, on a touch section, an upper surface that includes a disc-shaped central region and a ring-shaped upward-swelling periphery that extends from the disc-shaped central region,
wherein a portion of the upper surface of the touch section that corresponds to an outer region of the ring-shaped upward-swelling periphery that is positioned outside an apex of the ring-shaped upward-swelling periphery has a regularly arranged pattern of recesses or protrusions, and
wherein a portion of the upper surface of the touch section that corresponds to an inner region of the ring-shaped upward-swelling periphery that is positioned inside the apex of the ring-shaped upward-swelling periphery has a regularly arranged pattern of recesses or protrusions.

15. A computer-implemented method comprising:
receiving an input on a touch section that is radially moveable from an initial position, the touch section being provided with an upper surface that includes a disc-shaped central region and a ring-shaped upward-swelling periphery that extends from the disc-shaped central region,
wherein a portion of the upper surface of the touch section that corresponds to an outer region of the ring-shaped upward-swelling periphery that is positioned outside an apex of the ring-shaped upward-swelling periphery has a regularly arranged pattern of recesses or protrusions, and
wherein a portion of the upper surface of the touch section that corresponds to an inner region of the ring-shaped upward-swelling periphery that is positioned inside the apex of the ring-shaped upward-swelling periphery and has a regularly arranged pattern of recesses or protrusions; and
providing, for output, a signal based on receiving the input.

* * * * *